United States Patent
Omori et al.

(10) Patent No.: US 10,930,521 B2
(45) Date of Patent: Feb. 23, 2021

(54) LIGHT IRRADIATION TYPE HEAT TREATMENT METHOD

(71) Applicant: SCREEN HOLDINGS CO., LTD., Kyoto (JP)

(72) Inventors: Mao Omori, Kyoto (JP); Masashi Furukawa, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 14 days.

(21) Appl. No.: 16/518,522

(22) Filed: Jul. 22, 2019

(65) Prior Publication Data

US 2020/0075344 A1 Mar. 5, 2020

(30) Foreign Application Priority Data

Aug. 28, 2018 (JP) .............................. JP2018-159167

(51) Int. Cl.
*H01L 21/324* (2006.01)
*H01L 21/687* (2006.01)
*H01L 21/66* (2006.01)

(52) U.S. Cl.
CPC ...... *H01L 21/324* (2013.01); *H01L 21/68714* (2013.01); *H01L 22/20* (2013.01)

(58) Field of Classification Search
CPC . H01L 21/324; H01L 21/68714; H01L 22/20; H01L 21/2686; H01L 21/67248;
(Continued)

(56) References Cited

U.S. PATENT DOCUMENTS

2005/0274709 A1 12/2005 Kusuda
2009/0245761 A1* 10/2009 Nakajima ......... H01L 21/68707
392/416
(Continued)

FOREIGN PATENT DOCUMENTS

JP 2017-045982 A 3/2017
KR 2003-0035895 A 5/2003

OTHER PUBLICATIONS

Korean Notification of Reasons for Refusal issued in corresponding Korean Patent Application No. 10-2019-0090084, dated Dec. 23, 2020, with English translation.

*Primary Examiner* — Mohammed R Alam
(74) *Attorney, Agent, or Firm* — McDermott Will & Emery LLP

(57) ABSTRACT

Heating treatment is performed on a semiconductor wafer in an ammonia atmosphere formed in a chamber by light irradiation from halogen lamps and flash lamps. For the formation of the ammonia atmosphere in the chamber, pressure in the chamber is once reduced. The pressure in the chamber is also reduced after the heating treatment of the semiconductor wafer. Light irradiation from the halogen lamps is performed to heat the atmosphere in the chamber before the pressure in the chamber is reduced by exhausting the atmosphere from the chamber. The heating of the atmosphere in the chamber before the pressure reduction activates the thermal motion of gas molecules in the atmosphere and decreases a gas density. As a result, the gas molecules in the chamber are discharged rapidly during the pressure reduction, so that the pressure in the chamber is reduced to a predetermined pressure in a short time.

7 Claims, 10 Drawing Sheets

(58) Field of Classification Search
CPC ......... H01L 21/68707; H01L 21/67115; H01L 21/02
See application file for complete search history.

(56) References Cited

U.S. PATENT DOCUMENTS

| | | | | |
|---|---|---|---|---|
| 2012/0244725 A1* | 9/2012 | Fuse | ................. | H01L 21/68742 438/799 |
| 2013/0078802 A1* | 3/2013 | Fuse | ................... | H01L 21/2686 438/660 |
| 2013/0259457 A1* | 10/2013 | Yokouchi | .......... | H01L 21/68785 392/416 |
| 2017/0062249 A1 | 3/2017 | Aoyama et al. | | |

* cited by examiner

F I G. 3
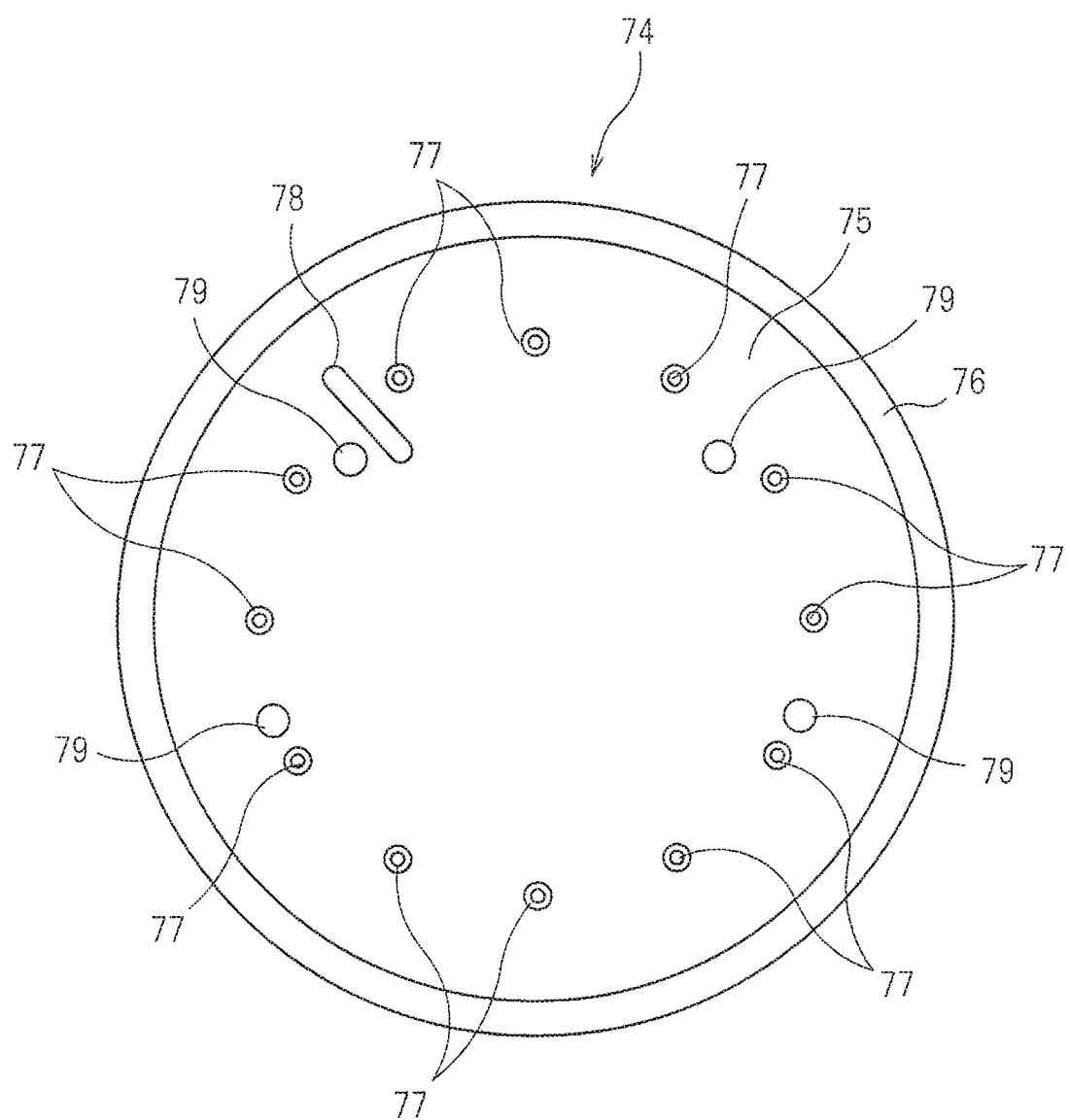

F I G. 4
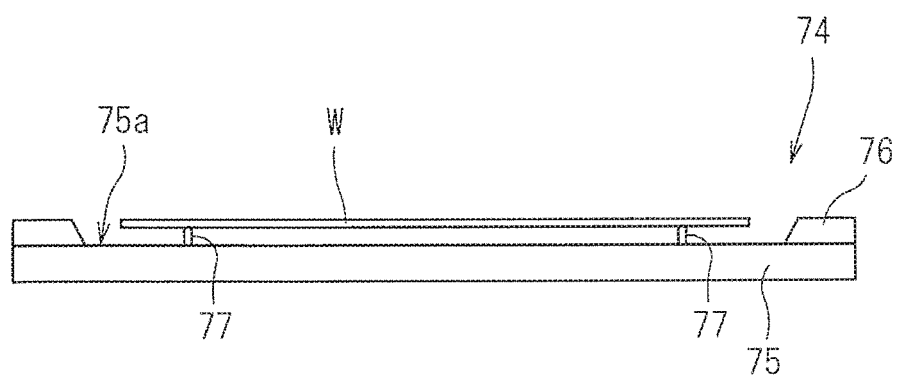

LIGHT IRRADIATION TYPE HEAT TREATMENT METHOD

BACKGROUND OF THE INVENTION

Field of the Invention

The present invention relates to a heat treatment method which irradiates a thin plate-like precision electronic substrate (hereinafter referred to simply as a "substrate") such as a semiconductor wafer with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature in an extremely short time, thereby achieving only the activation of the impurities without deep diffusion of the impurities.

On the other hand, an attempt has been made to perform the flash lamp annealing in an atmosphere of a reactive gas such as ammonia. For example, U.S. Patent Application Publication No. 2017/0062249 discloses that an ammonia atmosphere is formed in a chamber which receives therein a semiconductor wafer with a high dielectric constant gate insulator film (a high-k film) formed thereon and the semiconductor wafer is heated by irradiation with a flash of light, whereby post deposition anneal is performed on the high dielectric constant gate insulator film. In an apparatus disclosed in U.S. Patent Application Publication No. 2017/0062249, the ammonia atmosphere is formed in the chamber by supplying ammonia into the chamber after the pressure in the chamber which receives the semiconductor wafer therein is reduced. In the apparatus disclosed in U.S. Patent Application Publication No. 2017/0062249, the semiconductor wafer already heat-treated in the ammonia atmosphere is transported out of the chamber after the detrimental ammonia is discharged and replaced with a nitrogen atmosphere by reducing the pressure in the chamber.

As disclosed in U.S. Patent Application Publication No. 2017/0062249, the formation of the atmosphere of the reactive gas such as ammonia for the heating treatment of the semiconductor wafer requires the pressure reduction process to be performed twice, i.e. before and after the heating treatment Specifically, the pressure in the chamber is reduced before the formation of the ammonia atmosphere, and the pressure in the chamber is reduced also after the heating treatment for the purpose of discharging the ammonia. There are cases in which atmospheres of a plurality of treatment gases are formed in sequential order for the treatment of a semiconductor wafer in some types of processes. In these cases, the number of times of the pressure reduction process is further increased. As a result, there arises a problem that a prolonged time period required for the pressure reduction process increases the amount of time for treatment per semiconductor wafer to decrease throughput.

SUMMARY

The present invention is intended for a method of heating a substrate by irradiating the substrate with light.

According to one aspect of the present invention, the method comprises the steps of: (a) irradiating a substrate held by a susceptor in a chamber with light from a continuous lighting lamp to preheat the substrate and thereafter irradiating the substrate with a flash of light from a flash lamp to perform flash heating on the substrate; (b) exhausting an atmosphere from the chamber to reduce pressure in the chamber; and (c) performing light irradiation from the continuous lighting lamp to heat the atmosphere in the chamber, the step (c) being performed before the step (b).

This method activates the thermal motion of gas molecules in the atmosphere in the chamber and decreases a gas density. As a result, the pressure in the chamber is reduced in a short time.

Preferably, the step (c) is further performed continuously after the start of the step (b).

This allows the pressure reduction in the chamber in a shorter time.

It is therefore an object of the present invention to reduce pressure in a chamber in a short period of time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a susceptor;

FIG. 4 is a sectional view of the susceptor,

DESCRIPTION OF THE PREFERRED EMBODIMENTS

Preferred embodiments according to the present invention will now be described in detail with reference to the drawings.

First Preferred Embodiment

Figure 1:
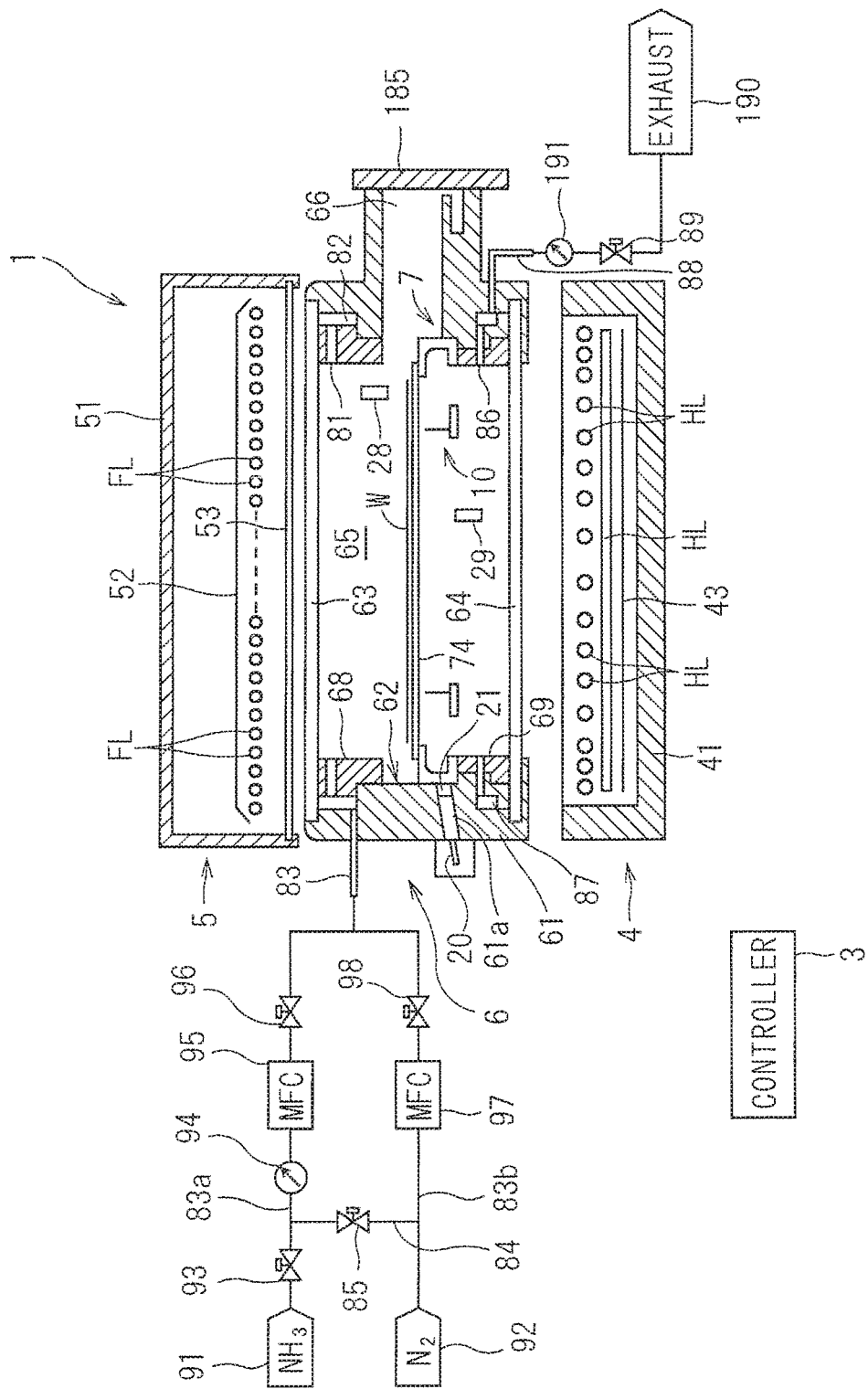
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). A high dielectric constant film (a high-k film) serving as a gate insulator film is formed on the semiconductor wafer W prior to the transport into the heat treatment apparatus 1, and the heat treatment apparatus 1 performs a heating treatment to thereby perform PDA (post deposition anneal) on the high dielectric constant film. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for directing infrared radiation emitted from the lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65.

At least one gas supply opening 81 for supplying a treatment gas (in the present preferred embodiment, nitrogen gas ($N_2$) and/or ammonia ($NH_3$)) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is divided into two branch pipes. One of the two branch pipes is a reactive gas pipe 83a connected to an ammonia supply source 91, and the other is an inert gas pipe 83b connected to a nitrogen supply source 92. The ammonia supply source 91 feeds ammonia to the reactive gas pipe 83a under the control of the controller 3. The nitrogen supply source 92 feeds nitrogen gas to the inert gas pipe 83b under the control of the controller 3.

A supply source valve 93, a supply check pressure gauge 94, a mass flow controller 95, and a supply valve 96 are interposed in the reactive gas pipe 83a. When the supply source valve 93 and the supply valve 96 are opened, ammonia is fed from the ammonia supply source 91 through the reactive gas pipe 83a and the gas supply pipe 83 to the buffer space 82. The supply check pressure gauge 94 judges whether ammonia is supplied at a predetermined pressure from the ammonia supply source 91 through the reactive gas pipe 83a or not. The mass flow controller 95 regulates the flow rate of ammonia flowing through the reactive gas pipe 83a to a predetermined set value.

On the other hand, a mass flow controller 97 and a supply valve 98 are interposed in the inert gas pipe 83b. When the supply valve 98 is opened, nitrogen gas is fed from the nitrogen supply source 92 through the inert gas pipe 83b and the gas supply pipe 83 to the buffer space 82. The mass flow controller 97 regulates the flow rate of nitrogen gas flowing through the inert gas pipe 83b to a predetermined set value. When all of the supply source valve 93, the supply valve 96, and the supply valve 98 are open, ammonia fed from the reactive gas pipe 83a and nitrogen gas fed from the inert gas pipe 83b are joined together in the gas supply pipe 83, so that a gas mixture of ammonia and nitrogen gas is fed to the buffer space 82.

A bypass pipe 84 for connecting the reactive gas pipe 83a and the inert gas pipe 83b to each other for communication therebetween is further provided. The bypass pipe 84 connects a portion of the reactive gas pipe 83a which lies between the supply source valve 93 and the supply check pressure gauge 94 and a portion of the inert gas pipe 83b which lies between the nitrogen supply source 92 and the mass flow controller 97 to each other for communication therebetween. A bypass valve 85 is interposed in the bypass pipe 84. When the bypass valve 85 is opened, the reactive gas pipe 83a and the inert gas pipe 83b are brought into communication with each other.

The treatment gas fed from the gas supply pipe 83 and flowing in the buffer space 82 flows in a spreading manner within the buffer space 82 which is lower in fluid resistance than the gas supply opening 81 to fill the buffer space 82. Then, the treatment gas filling the buffer space 82 is supplied through the gas supply opening 81 into the heat treatment space 65.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. An exhaust valve 89 and a vacuum pressure gauge 191 are interposed in the gas exhaust pipe 88. When the exhaust valve 89 is opened, the gas in the heat treatment space 65 is exhausted through the gas exhaust opening 86 and the buffer space 87 to the gas exhaust pipe 88. The vacuum pressure gauge 191 measures the pressure in the gas exhaust pipe 88 directly. The pressure measured by the vacuum pressure gauge 191 is the pressure in the chamber 6 because the pressure in a portion of the gas exhaust pipe 88 where the vacuum pressure gauge 191 is provided is approximately equal to the pressure in the chamber 6. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A vacuum pump and a utility exhaust system in a factory in which the heat treatment apparatus 1 is installed may be used as the exhaust part 190. When a vacuum pump is employed as the exhaust part 190 to exhaust the atmosphere provided in the heat treatment space 65 which is an enclosed space while no gas is supplied from the gas supply opening 81, the atmosphere provided in the chamber 6 is reduced in pressure to a vacuum atmosphere. When the vacuum pump is not used as the exhaust part 190, the pressure of the atmosphere provided in the chamber 6 is reduced to a pressure lower than atmospheric pressure by exhausting the atmosphere provided in the heat treatment space 65 while the gas is not supplied from the gas supply opening 81. The pressure in the chamber 6 which is being reduced is measured by the vacuum pressure gauge 191.

Figure 2:
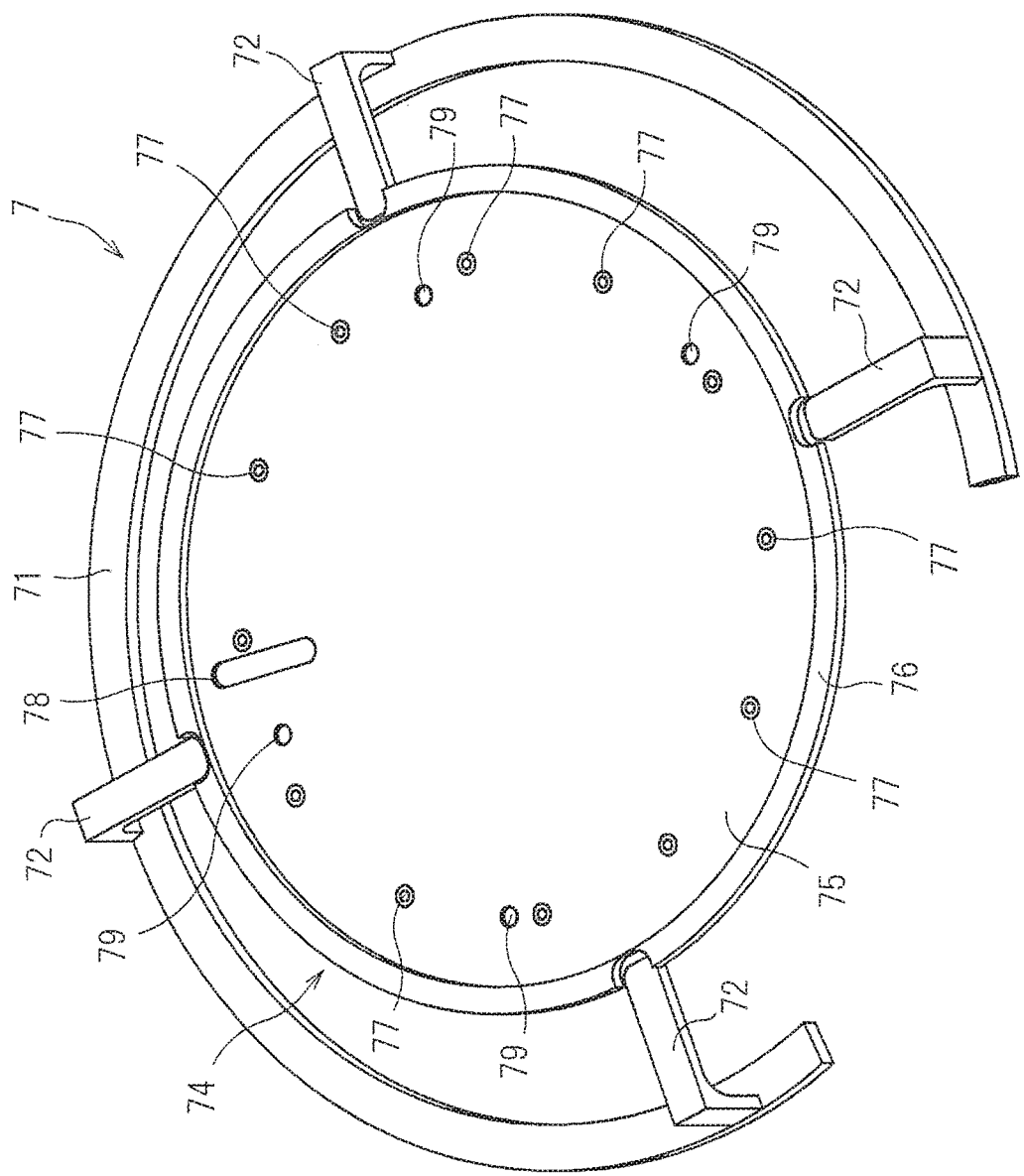
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
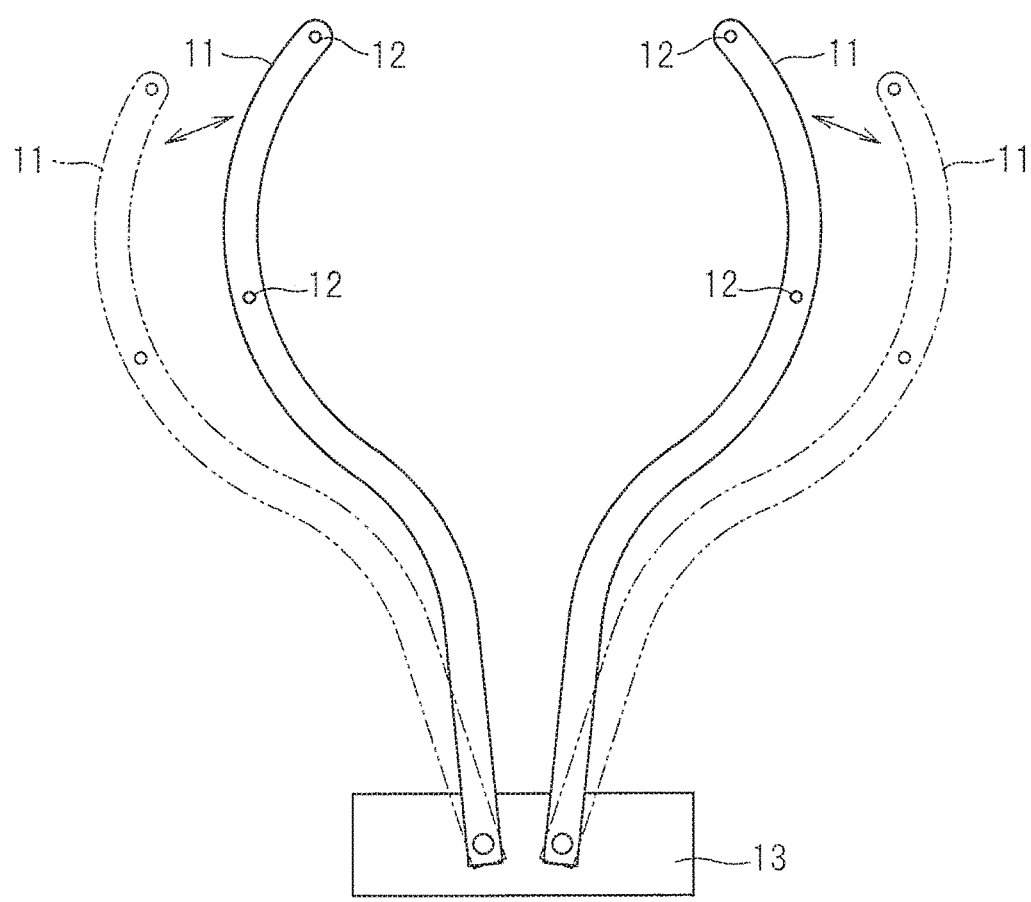
FIG. 5 is a plan view of a transfer mechanism.
Figure 6:
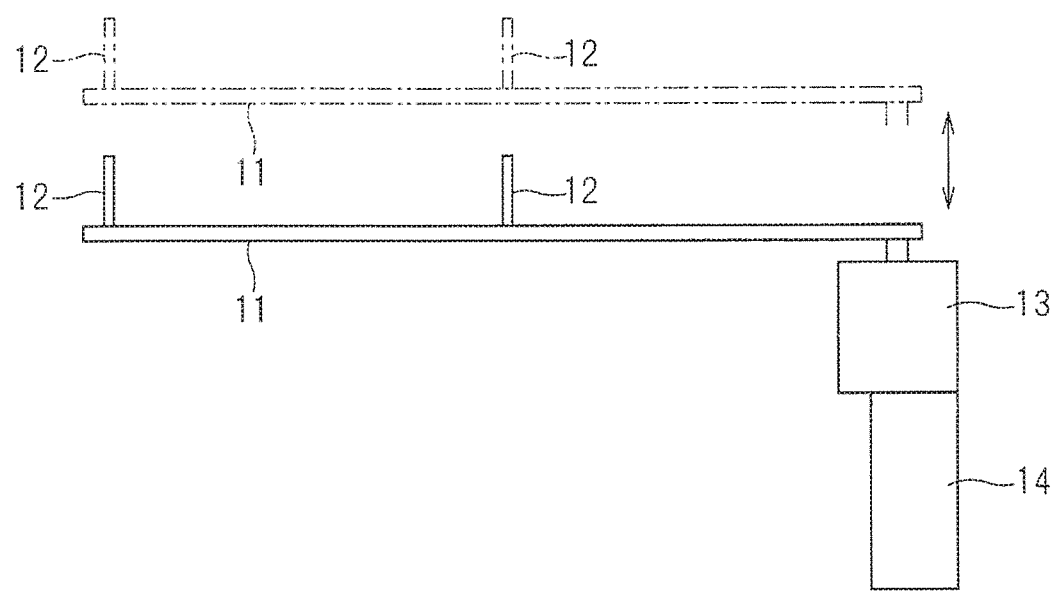
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 1'1 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

The heat treatment apparatus 1 further includes an atmosphere thermometer 28 for measuring the atmosphere temperature in the chamber 6, and a radiation thermometer 29 for measuring the temperature of the susceptor 74. The atmosphere thermometer 28 is constructed using a thermocouple, for example. The radiation thermometer 29 receives infrared radiation emitted from the susceptor 74 made of quartz to measure the temperature of the susceptor 74, based on the intensity of the received infrared radiation.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
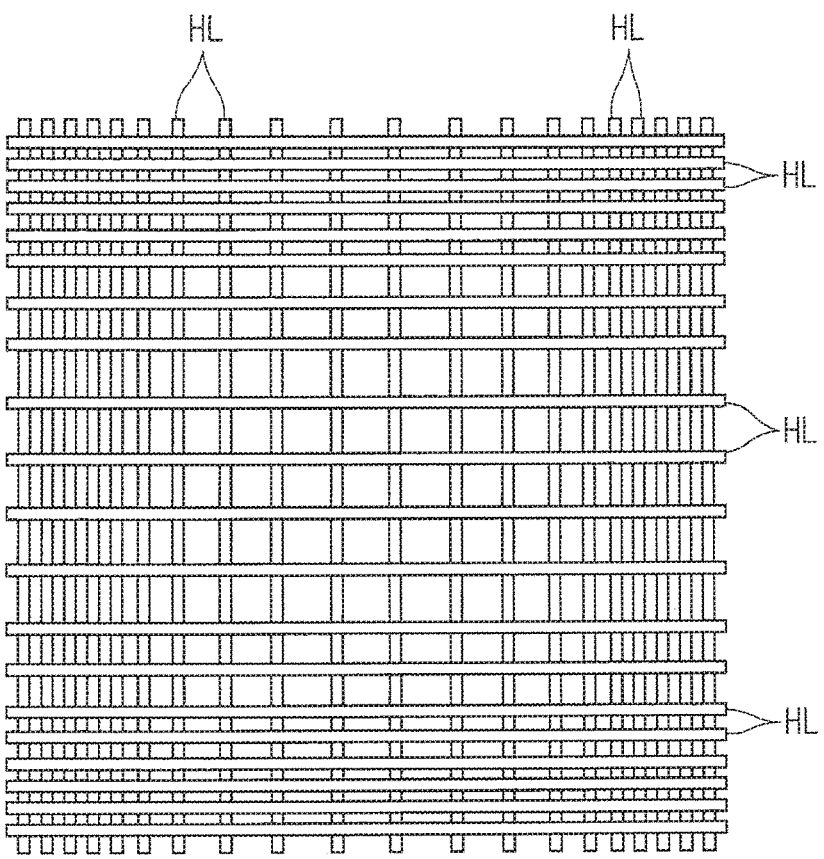
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 8:
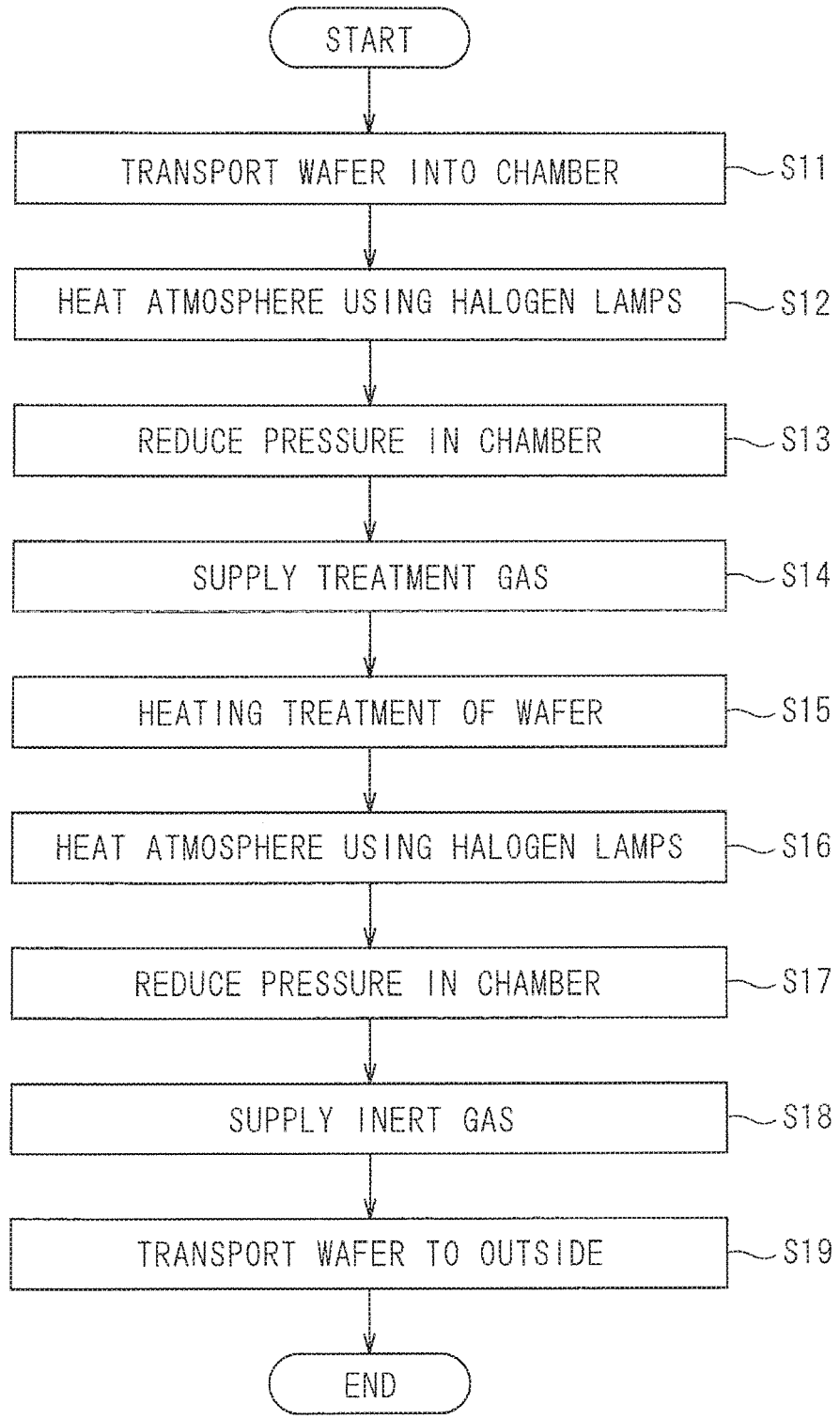
FIG. 8 is a flow diagram showing a procedure for treatment of a semiconductor wafer according to a first preferred embodiment of the present invention.

Next, a treatment operation in the heat treatment apparatus 1 will be described. FIG. 8 is a flow diagram showing a procedure for treatment of a semiconductor wafer W according to a first preferred embodiment of the present invention. The semiconductor wafer W to be treated herein is a silicon semiconductor substrate with a high dielectric constant film formed thereon as a gate insulator film. The high dielectric constant film is deposited on the front surface of the semiconductor wafer W, for example, by a technique including ALD (atomic layer deposition), MOCVD (metal organic chemical vapor deposition), and the like. The heat treatment apparatus 1 irradiates the semiconductor wafer W with a flash of light in an ammonia atmosphere to perform PDA (post deposition anneal) on the semiconductor wafer W, thereby eliminating defects in the deposited high dielectric constant film. The procedure for the treatment in the heat treatment apparatus 1 to be described below proceeds under the control of the controller 3 over the operating mechanisms of the heat treatment apparatus 1.

First, the semiconductor wafer W with the high dielectric constant film formed thereon is transported into the chamber 6 of the heat treatment apparatus 1 (Step S11). For the transport of the semiconductor wafer W into the chamber 6, the gate valve 185 is opened to open the transport opening 66. A transport robot outside the heat treatment apparatus 1 transports the semiconductor wafer W with the high dielectric constant film formed thereon through the transport opening 66 into the heat treatment space 65 of the chamber 6. At this time, an atmosphere outside the heat treatment apparatus 1 is carried into the heat treatment space 65 of the chamber 6 as the semiconductor wafer W is transported into the heat treatment space 65 because the pressure inside and outside the chamber 6 is equal to atmospheric pressure. To prevent this, nitrogen gas may be continuously supplied from the nitrogen supply source 92 into the chamber 6 by opening the supply valve 98 to cause the nitrogen gas to flow outwardly through the opened transport opening 66, thereby minimizing the atmosphere outside the heat treatment apparatus 1 flowing into the chamber 6. It is further preferable that the exhaust valve 89 is closed to stop exhausting the gas from the chamber 6 when the gate valve 185 is open. This causes the nitrogen gas supplied into the chamber 6 to flow outwardly only through the transport opening 66, thereby effectively preventing the outside atmosphere from flowing into the chamber 6.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof where the high dielectric constant film is deposited is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

Figure 9:
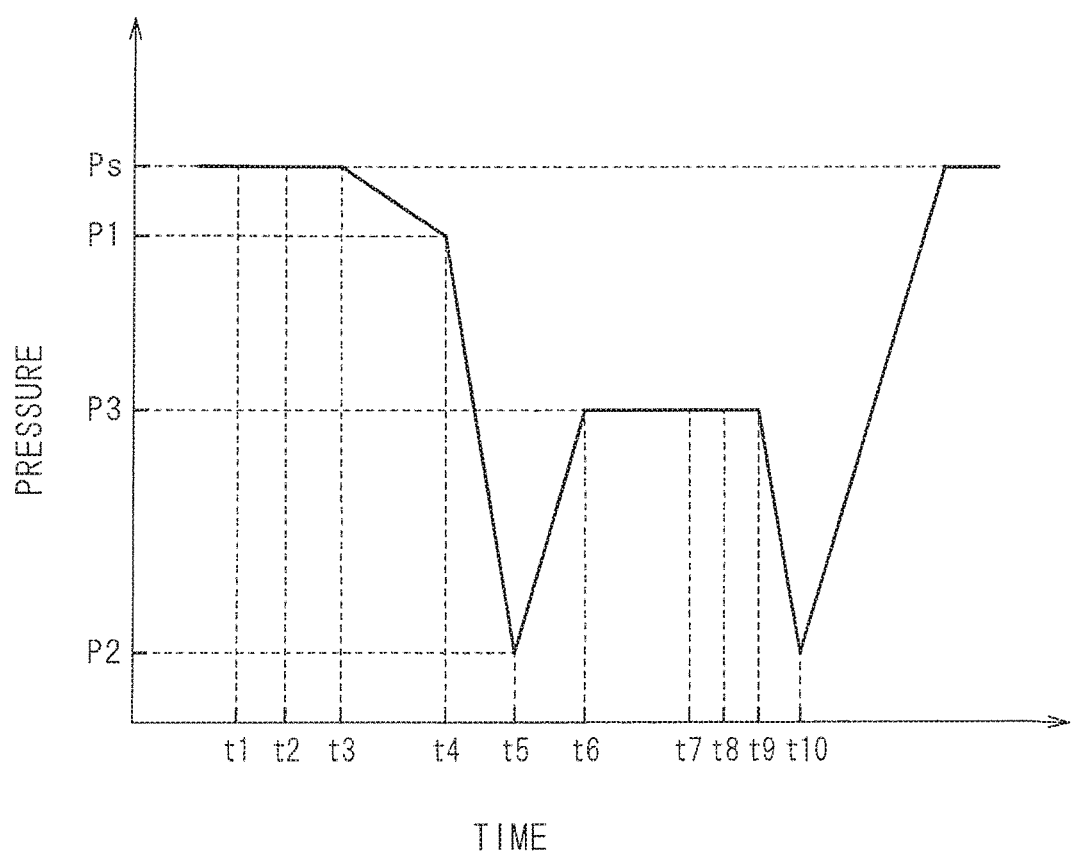
FIG. 9 is a graph showing changes in pressure in a chamber.

After the semiconductor wafer W is received in the chamber 6 and the transport opening 66 is closed by the gate valve 185, pressure in the chamber 6 is reduced to a pressure lower than atmospheric pressure. FIG. 9 is a graph showing changes in pressure in the chamber 6. In FIG. 9, the abscissa represents time, and the ordinate represents pressure in the chamber 6. At a point of time t1 when the semiconductor wafer W is received in the chamber 6 and the transport opening 66 is closed, the pressure in the chamber 6 is equal to ordinary pressure Ps (=atmospheric pressure=approximately 101325 Pa).

In the first preferred embodiment, the atmosphere in the chamber 6 is heated by irradiation with light from the halogen lamps HL of the halogen heating part 4 (Step S12) at time t2 before the pressure reduction in the chamber 6. Part of light emitted from the halogen lamps HL is directly absorbed by gas molecules of the atmosphere in the chamber 6, so that the temperature of the atmosphere is increased. Part of light emitted from the halogen lamps HL is also absorbed by the semiconductor wafer W held by the susceptor 74, so that the temperature of the atmosphere in the chamber 6 is increased also by heat transfer from the heated semiconductor wafer W.

The temperature of the atmosphere in the chamber 6 is measured with the atmosphere thermometer 28 when the atmosphere in the chamber 6 is heated by irradiation with light from the halogen lamps HL. The temperature of the atmosphere in the chamber 6 measured with the atmosphere thermometer 28 is transmitted to the controller 3. The controller 3 effects feedback control of the output from the halogen lamps HL so that the temperature of the atmosphere in the chamber 6 is equal to a target temperature TP, based on the value measured with the atmosphere thermometer 28. The rate of increase in temperature of the atmosphere in the chamber 6 and the target temperature TP are not particularly limited. For example, the rate of increase in temperature is 20° C./sec, and the target temperature TP is 250° C. That is, the controller 3 effects feedback control of the output from the halogen lamps HL so that the value measured with the atmosphere thermometer 28 is increased to 250° C. at a rate of 20° C./sec.

The pressure reduction in the chamber 6 is started (Step S13) at time t3 after the temperature of the atmosphere in the chamber 6 reaches the target temperature TP. Specifically, when the transport opening 66 is closed, so that the heat treatment space 65 of the chamber 6 becomes an enclosed space. In this state, the exhaust valve 89 is opened while the supply valve 96 and the supply valve 98 for supplying the gas are closed. Thus, the gas is exhausted from the chamber 6 while the gas is not supplied into the chamber 6, so that the pressure in the heat treatment space 65 of the chamber 6 is reduced to less than atmospheric pressure. In an early stage of the pressure reduction, the exhaust part 190 exhausts the atmosphere from the chamber 6 at a relatively low exhaust flow rate to reduce the pressure in the chamber 6.

Next, at time t4 when the pressure in the chamber 6 measured by the vacuum pressure gauge 191 is reduced to a pressure P1, the exhaust flow rate of the atmosphere exhausted by the exhaust part 190 increases, so that the exhaust speed thereof becomes faster. The pressure P1 is, for example, approximately 20000 Pa. At time t5, the pressure (degree of vacuum) in the chamber 6 reaches a pressure P2. The pressure P2 is, for example, approximately 100 Pa. That is, after the atmosphere is exhausted at a low exhaust flow rate in the early stage of the pressure reduction, the exhaust flow rate is changed to a higher exhaust flow rate, and the atmosphere is exhausted at the higher exhaust flow rate.

If the atmosphere is exhausted rapidly at a high exhaust flow rate at the start of the pressure reduction, there is a danger that a large gas flow change occurs in the chamber 6 to cause particles deposited on structures (e.g., the lower chamber window 64) in the chamber 6 to swirl up and be deposited again on the semiconductor wafer W, resulting in contamination of the semiconductor wafer W. Such particles in the chamber 6 are prevented from swirling up by exhausting the atmosphere calmly at a low exhaust flow rate in the early stage of the pressure reduction, thereafter changing the exhaust flow rate to a higher exhaust flow rate, and exhausting the atmosphere at the higher exhausted flow rate.

At the time t5 when the pressure in the chamber 6 reaches the pressure P2, the supply of the treatment gas into the chamber 6 is started (Step S14). Specifically, the supply source valve 93, the supply valve 96, and the supply valve 98 are opened while the exhaust valve 89 is open. Specifically, ammonia is fed from the reactive gas pipe 83*a* by opening the supply source valve 93 and the supply valve 96. Also, nitrogen gas is fed from the inert gas pipe 83*b* by opening the supply valve 98. The fed ammonia and nitrogen gas are joined together in the gas supply pipe 83. Then, a gas mixture of ammonia and nitrogen gas is supplied into the heat treatment space 65 of the chamber 6. As a result, an ammonia atmosphere in a reduced-pressure condition is formed around the semiconductor wafer W held by the holder 7 in the chamber 6. The concentration of ammonia in the ammonia atmosphere (i.e., the mixture ratio between ammonia and nitrogen gas) is not particularly limited but may have an appropriate value. For example, the concentration of ammonia is required only to be not greater than 10 vol. % (in the present preferred embodiment, approximately 2.5 vol. %). The concentration of ammonia is adjustable by controlling the supply flow rates of ammonia and nitrogen gas by means of the mass flow controller 95 and the mass flow controller 97, respectively.

By supplying the gas mixture of ammonia and nitrogen gas into the chamber 6, the pressure in the chamber 6 is increased from the pressure P2 to reach a pressure P3 at time t6. The pressure P3 is, for example, approximately 5000 Pa. The oxygen concentration in the ammonia atmosphere formed in the chamber 6 is made extremely low because the pressure in the chamber 6 is reduced once to the pressure P2 and then increased to the pressure P3. After the time t6 when the pressure in the chamber 6 is increased to the pressure P3, the supply flow rate of the ammonia-nitrogen gas mixture into the chamber 6 and the exhaust flow rate thereof from the chamber 6 are made equal to each other, so that the pressure in the chamber 6 is maintained at the pressure P3.

Next, the heating treatment of the semiconductor wafer W is performed (Step S15) after the time t6 when the pressure in the chamber 6 is increased to the pressure P3. First, the semiconductor wafer W is preheated (assist-heated) by irradiation with light from the 40 halogen lamps HL in the halogen heating part 4. Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 is in the range of 300° to 600° C., and is 450° C. in the present preferred embodiment.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at time t7 when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. By irradiating the front surface of the semiconductor wafer W with the high dielectric constant film deposited thereon with a flash of light from the flash lamps FL, the temperature of the front surface of the semiconductor wafer W including the high dielectric constant film momentarily increases to a treatment temperature T2, so that the PDA is performed. The treatment temperature T2 that is the maximum temperature (peak temperature) reached by the front surface of the semiconductor wafer W subjected to the flash irradiation is in the range of 600° to 1200° C., and is 1000° C. in the present preferred embodiment.

The PDA performed by the increase in temperature of the front surface of the semiconductor wafer W to the treatment temperature T2 in the ammonia atmosphere promotes the nitriding of the high dielectric constant film and eliminates defects such as point defects present in the high dielectric constant film. The time period for the irradiation with light from the flash lamps FL is a short time period ranging from about 0.1 to about 100 milliseconds. Accordingly, the time required for the temperature of the front surface of the semiconductor wafer W to increase from the preheating temperature T1 to the treatment temperature T2 is also an extremely short time period of less than one second. Immediately after the flash irradiation, the temperature of the front surface of the semiconductor wafer W rapidly decreases from the treatment temperature T2.

After the completion of the flash heating treatment, the atmosphere in the chamber 6 is heated again by irradiation with light from the halogen lamps HL at time t8 (Step S16). As in Step S12, the atmosphere in the chamber 6 is heated directly by the irradiation with light from the halogen lamps HL, and is in addition heated indirectly by the heat transfer from the heated semiconductor wafer W. Also, the controller 3 effects feedback control of the output from the halogen lamps HL so that the temperature of the atmosphere in the chamber 6 is equal to the target temperature TP, based on the value measured with the atmosphere thermometer 28.

At time t9 after the temperature of the atmosphere in the chamber 6 reaches the target temperature TP, the reduction in pressure in the chamber 6 starts (Step S17). Specifically, the exhaust valve 89 is opened while the supply valve 96 and the supply valve 98 are closed. This exhausts the atmosphere from the chamber 6 to reduce the pressure in the chamber 6 again. The pressure in the chamber 6 reaches the pressure P2 at time t10. The pressure in the chamber 6 is reduced to the pressure P2 again by exhausting the atmosphere from the chamber 6, whereby the detrimental ammonia is discharged from the heat treatment space 65 of the chamber 6.

Subsequently, the exhaust valve 89 is closed and the supply valve 98 is opened, so that the nitrogen gas is supplied as the inert gas from the nitrogen supply source 92 into the chamber 6 to return the pressure in the chamber 6 to the ordinary pressure Ps (Step S18). Thus, the atmosphere in the chamber 6 is replaced with a nitrogen atmosphere. The halogen lamps HL turn off. This causes the temperature of the semiconductor wafer W to decrease also from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W (Step S19).

In the first preferred embodiment, the atmosphere in the chamber 6 is heated by the irradiation with light from the halogen lamps HL before the pressure in the chamber 6 is reduced by exhausting the atmosphere from the chamber 6 during the treatment of the semiconductor wafer W (Steps S12 and S16). The heating of the atmosphere in the chamber 6 before the pressure reduction activates the thermal motion of the gas molecules in the atmosphere and decreases a gas density. As a result, the gas molecules in the chamber 6 are discharged rapidly during the pressure reduction, so that the pressure in the chamber 6 is reduced to a predetermined pressure in a short time. This suppresses the increase in time for treatment of the semiconductor wafer W involving the pressure reduction process to prevent throughput from decreasing.

In the first preferred embodiment, the atmosphere in the chamber 6 is heated by the irradiation with light from the halogen lamps HL, with the semiconductor wafer W present in the chamber 6. The temperature of the semiconductor wafer W is lower than the aforementioned preheating temperature T1 when the temperature of the atmosphere in the chamber 6 is equal to the target temperature TP. Thus, there is no danger that the irradiation with light from the halogen lamps HL for the pressure reduction process exerts significant influence on the heat treatment history of the semiconductor wafer W.

Second Preferred Embodiment

Next, a second preferred embodiment according to the present invention will be described. The second preferred embodiment is similar in configuration of the heat treatment apparatus 1 and in procedure for treatment of the semiconductor wafer W to the first preferred embodiment. In the first preferred embodiment, the atmosphere in the chamber 6 is heated and the pressure reduction process is then performed during the treatment of the semiconductor wafer W, i.e. before and after the flash heating while the semiconductor wafer W is held by the susceptor 74. In the second preferred embodiment, on the other hand, the atmosphere in the chamber 6 is heated and the pressure reduction process is then performed at the time of the maintenance of the heat treatment apparatus 1.

Maintenance is performed on the aforementioned heat treatment apparatus 1 at regular or irregular time intervals. Irregular maintenance is performed when some failure occurs in the heat treatment apparatus 1. The interior of the chamber 6 is opened and the various pipes are detached from the heat treatment apparatus 1 at the time of the maintenance of the heat treatment apparatus 1, regardless of whether the maintenance is regular or irregular. It is hence necessary that detrimental ammonia is completely discharged from the entire heat treatment apparatus 1 including the heat treatment space 65 of the chamber 6 and the various pipes before the maintenance. To this end, the supply valve 96 is opened to discharge the ammonia also from the reactive gas pipe 83a in addition to the heat treatment space 65 of the chamber 6.

Figure 10:
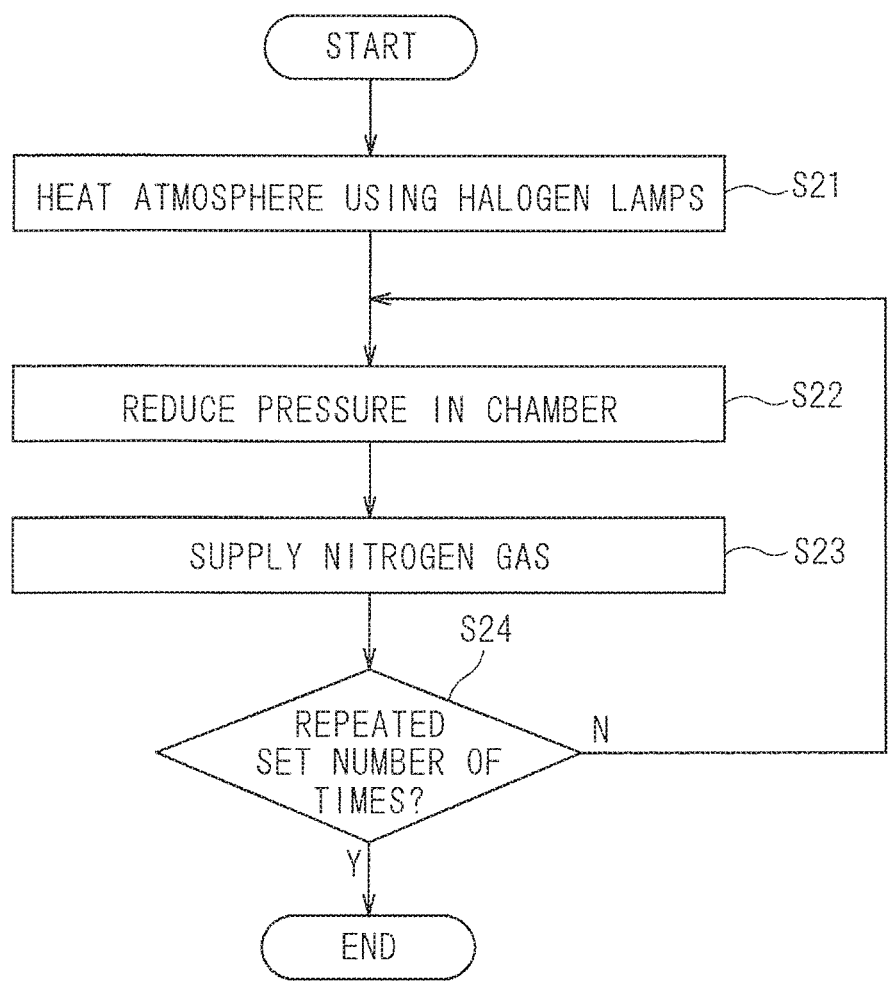
FIG. 10 is a flow diagram showing a procedure for atmosphere replacement in the chamber according to a second preferred embodiment of the present invention.

FIG. 10 is a flow diagram showing a procedure for atmosphere replacement in the chamber 6 according to the second preferred embodiment. First, light irradiation from the halogen lamps HL is performed to heat the atmosphere in the chamber 6 in the absence of a semiconductor wafer W in the chamber 6 before maintenance (Step S21). Part of light emitted from the halogen lamps HL is directly absorbed by gas molecules of the atmosphere in the chamber 6, so that the atmosphere is directly heated. Part of light emitted from the halogen lamps HL is also absorbed by the structures such as the susceptor 74 in the chamber 6, so that the atmosphere in the chamber 6 is indirectly heated by the heat transfer from the structures.

The temperature of the atmosphere in the chamber 6 is measured with the atmosphere thermometer 28 when the atmosphere in the chamber 6 is heated by irradiation with light from the halogen lamps HL. The temperature of the atmosphere in the chamber 6 measured with the atmosphere thermometer 28 is transmitted to the controller 3. In the second preferred embodiment, the halogen lamps HL are turned on with constant electric power (for example, fixed at 30% of maximum electric power) to heat the atmosphere in the chamber 6 until the temperature of the atmosphere in the chamber 6 reaches the target temperature TP. That is, although the output from the halogen lamps HL is feedback-controlled in the first preferred embodiment, constant output control is effected in the second preferred embodiment. The target temperature TP of the atmosphere in the chamber 6 is, for example, 250° C. as in the first preferred embodiment.

The pressure reduction in the chamber 6 is started (Step S22) after the temperature of the atmosphere in the chamber 6 reaches the target temperature TP. Specifically, the supply source valve 93, the bypass valve 85, and the supply valve 98 are closed, whereas the supply valve 96 and the exhaust valve 89 are opened. Thus, the atmosphere in the chamber 6 and in the reactive gas pipe 83a including the mass flow controller 95 (precisely, a region of the reactive gas pipe 83a which is downstream of the supply source valve 93) is exhausted through the gas exhaust pipe 88, so that not only the pressure in the chamber 6 but also the pressure in the reactive gas pipe 83a is reduced. As a result, ammonia remaining in the reactive gas pipe 83a is also discharged.

Next, after the pressure in the chamber 6 measured by the vacuum pressure gauge 191 is reduced to a predetermined pressure, the pressure reduction is stopped, and the supply of the nitrogen gas into the reactive gas pipe 83a and the chamber 6 is performed (Step S23). At this time, the supply source valve 93 and the exhaust valve 89 are closed, whereas the supply valve 96, the supply valve 98, and the bypass valve 85 are opened. Thus, part of the nitrogen gas fed from the nitrogen supply source 92 is charged through the bypass pipe 84 into the reactive gas pipe 83a including the mass flow controller 95 (precisely, a region of the reactive gas pipe 83a which lies between the supply source valve 93 and the supply valve 96). The nitrogen gas fed from the nitrogen supply source 92 is also charged into the chamber 6.

After the nitrogen gas is charged into the chamber 6 and the reactive gas pipe 83a, the procedure proceeds to Step S24, in which the controller 3 determines whether the aforementioned pressure reduction process and the nitrogen gas supply have been repeated a set number of times or not. The number of times of repetition is previously set in the controller 3, for example, using a GUI (graphical user interface). When the pressure reduction process and the nitrogen gas supply have not yet been repeated the set number of times, the pressure reduction process in Step S22 and the nitrogen gas supply in Step S23 are repeated again. For example, when the number of times of repetition is set to "10", the aforementioned pressure reduction process and the nitrogen gas supply are repeated ten times. Thus, the ammonia is discharged from the reactive gas pipe 83a and the chamber 6 with reliability, and the nitrogen gas is charged into the reactive gas pipe 83a and the chamber 6.

In the second preferred embodiment, the atmosphere in the chamber 6 is heated by the irradiation with light from the halogen lamps HL and the pressure in the chamber 6 is then reduced by exhausting the atmosphere from the chamber 6 before the maintenance of the heat treatment apparatus 1. The heating of the atmosphere in the chamber 6 before the pressure reduction activates the thermal motion of the gas molecules in the atmosphere and decreases the gas density. As a result, the gas molecules in the chamber 6 are discharged rapidly during the pressure reduction, so that the pressure in the chamber 6 is reduced to a predetermined pressure in a short time, as in the first preferred embodiment. This allows the reduction in time required for the nitrogen gas purge before the maintenance.

<Modifications>

While the preferred embodiments according to the present invention have been described hereinabove, various modifications of the present invention in addition to those described above may be made without departing from the scope and spirit of the invention. For example, the atmosphere in the chamber 6 is heated before the pressure in the chamber 6 is reduced in the first and second preferred embodiments. In addition to this, the atmosphere in the chamber 6 may be heated by the irradiation with light from the halogen lamps HL continuously after the start of the pressure reduction in the chamber 6. The heating of the atmosphere in the chamber 6 by the irradiation with light from the halogen lamps HL also after the start of the pressure reduction in the chamber 6 allows the pressure reduction in a shorter period of time. Alternatively, the heating of the atmosphere in the chamber 6 by the irradiation with light from the halogen lamps HL may be started after the start of the pressure reduction in the chamber 6.

In the first preferred embodiment, the output from the halogen lamps HL is feedback-controlled. In place of this, the halogen lamps HL may be turned on with constant electric power to heat the atmosphere in the chamber 6 until the temperature of the atmosphere in the chamber 6 reaches the target temperature TP, as in the second preferred embodiment. In the second preferred embodiment, on the other hand, the output from the halogen lamps HL may be feedback-controlled so that the temperature of the atmosphere in the chamber 6 is equal to the target temperature TP, based on the value measured with the atmosphere thermometer 28. That is, whether to effect feedback control or constant output control of the output from the halogen lamps HL may be selected, as appropriate. Alternatively, the feedback control and the constant output control may be combined together. As an example, the constant output control of the output from the halogen lamps HL may be effected while the temperature of the atmosphere in the chamber 6 is relatively low, whereas the feedback control of the output from the halogen lamps HL is effected after the temperature of the atmosphere in the chamber 6 approaches the target temperature TP.

Also, the feedback control of the output from the halogen lamps HL may be effected based on the temperature of the susceptor 74 measured with the radiation thermometer 29 or the temperature of the semiconductor wafer W measured with the radiation thermometer 20 in place of the temperature of the atmosphere in the chamber 6. However, the feedback control of the output from the halogen lamps HL based on the temperature of the atmosphere in the chamber 6 measured with the atmosphere thermometer 28 as in the first preferred embodiment enables the temperature of the atmosphere in the chamber 6 to be equal to the target temperature TP more directly.

In the aforementioned preferred embodiments, ammonia is supplied through the reactive gas pipe 83a. The present invention, however, is not limited to this. Oxygen ($O_2$), hydrogen ($H_2$), chlorine ($Cl_2$), hydrogen chloride (HCl), ozone ($O_3$), nitrogen monoxide (NO), nitrous oxide ($N_2O$), nitrogen dioxide ($NO_2$), nitrogen trifluoride ($NF_3$) or the like may be supplied as the reactive gas through the reactive gas pipe 83a. The gas supplied through the inert gas pipe 83b is not limited to nitrogen gas. Argon (Ar), helium (He) or the like may be supplied as the inert gas through the inert gas pipe 83b.

In the first preferred embodiment, the heating treatment of the semiconductor wafer W is performed while the ammonia atmosphere is formed in the chamber 6. However, a plurality of types of different atmospheres may be formed in the chamber 6 in succession for the treatment of the semiconductor wafer W. In this case, the pressure in the chamber 6 is reduced a plurality of times during the treatment of one semiconductor wafer W. Thus, the technique according to the present invention may be well applied to reduce the pressure in the chamber 6 every time in a short time, thereby shortening the treatment time.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating. In this case, the atmosphere in the chamber 6 is heated by light irradiation from the arc lamps before the pressure reduction process.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell. Also, the heat treatment apparatus 1 may perform the activation of implanted impurities, the joining of metal and silicon, and the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with light, comprising the steps of: (a) irradiating a substrate held by a susceptor in a chamber with light from a continuous lighting lamp to preheat said substrate and thereafter irradiating said substrate with a flash of light from a flash lamp to perform flash heating on said substrate; (b) exhausting an atmosphere from said chamber to reduce pressure in said chamber; and (c) performing light irradiation from said continuous lighting lamp to heat the atmosphere in said chamber; wherein said steps (b) and (c) are performed before and after said step (a).

2. The method according to claim 1, wherein
said step (c) is further performed continuously after the start of said step (b).

3. The method according to claim 1, wherein
said steps (b) and (c) are performed, with said substrate held by said susceptor in said chamber.

4. The method according to claim 1, wherein said steps (b) and (c) are performed in the absence of said substrate in said chamber.

5. The method according to claim 4, wherein
said steps (b) and (c) are performed before maintenance of said chamber.

6. The method according to claim 1, wherein
said continuous lighting lamp is turned on with constant electric power to heat the atmosphere in said chamber in said step (c).

7. The method according to claim 1, wherein
feedback control of an output from said continuous lighting lamp is effected based on the temperature of the atmosphere in said chamber or the temperature of said susceptor in said step (c).

* * * * *